United States Patent
Williams et al.

(10) Patent No.: US 9,397,201 B2
(45) Date of Patent: Jul. 19, 2016

(54) NON-VOLATILE MEMORY (NVM) CELL AND A METHOD OF MAKING

(71) Applicant: FREESCALE SEMICONDUCTOR, INC., Austin, TX (US)

(72) Inventors: Jacob T. Williams, Austin, TX (US); Cheong Min Hong, Austin, TX (US); Sung-Taeg Kang, Austin, TX (US); David G. Kolar, Austin, TX (US); Jane A. Yater, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/943,175

(22) Filed: Nov. 17, 2015

(65) Prior Publication Data
US 2016/0071960 A1    Mar. 10, 2016

Related U.S. Application Data

(62) Division of application No. 14/135,142, filed on Dec. 19, 2013, now Pat. No. 9,219,167.

(51) Int. Cl.
| | | |
|---|---|---|
| H01L 29/66 | (2006.01) | |
| H01L 29/792 | (2006.01) | |
| H01L 21/3213 | (2006.01) | |
| H01L 21/3105 | (2006.01) | |
| H01L 21/321 | (2006.01) | |
| H01L 29/423 | (2006.01) | |
| H01L 21/28 | (2006.01) | |
| H01L 29/788 | (2006.01) | |

(52) U.S. Cl.
CPC .... *H01L 29/66833* (2013.01); *H01L 21/28273* (2013.01); *H01L 21/28282* (2013.01); *H01L 21/31055* (2013.01); *H01L 21/3212* (2013.01); *H01L 21/32133* (2013.01); *H01L 21/32139* (2013.01); *H01L 29/42332* (2013.01); *H01L 29/42344* (2013.01); *H01L 29/66825* (2013.01); *H01L 29/7881* (2013.01); *H01L 29/792* (2013.01)

(58) Field of Classification Search
USPC .......................... 257/316, 319; 438/257, 261
See application file for complete search history.

(56) References Cited

U.S. PATENT DOCUMENTS

| | | | |
|---|---|---|---|
| 8,349,685 B2 | 1/2013 | Hui et al. | |
| 8,415,735 B2 | 4/2013 | Wang | |
| 2004/0065917 A1* | 4/2004 | Fan ................... | H01L 27/11521 257/315 |
| 2007/0207581 A1 | 9/2007 | Yasui et al. | |
| 2008/0121974 A1 | 5/2008 | Steimle et al. | |
| 2010/0029052 A1 | 2/2010 | Kang et al. | |

FOREIGN PATENT DOCUMENTS

EP        0997930 A1    5/2000

* cited by examiner

*Primary Examiner* — Dung Le

(57) ABSTRACT

A method of forming a flash memory cell includes forming a first hard mask and a second hard mask on a substrate. A select gate is formed as a spacer around the first hard mask. A charge storage layer is formed over the first and second hard masks and the select gate. A control gate is formed as a spacer around the second hard mask. A recess in the control gate is filled with a dielectric material. The recess is formed between a curved sidewall of the control gate and a sidewall of the charge storage layer directly adjacent the curved sidewall of the control gate.

11 Claims, 6 Drawing Sheets

NON-VOLATILE MEMORY (NVM) CELL AND A METHOD OF MAKING

This application is a divisional application of a U.S. patent application entitled "Non-Volatile Memory (NVM) Cell and a Method of Making", having a serial number of Ser. No. 14/135,142, now U.S. Pat. No. 9,219,167, having a filing date of Dec. 19, 2013, having common inventors, and having a common assignee, all of which is incorporated by reference in its entirety.

BACKGROUND

1. Field

This disclosure relates generally to NVMs, and more specifically, to NVM cells including the making thereof.

2. Related Art

Non-volatile memories (NVMs) have become common as both stand alone integrated circuits as well as embedded with other circuitry on the same integrated circuit. A particularly effective NVM cells for use in situations where high endurance and high retention are particularly important are ones using thin film storage such as nanocrystals. Nitride may also be used in similar situations to where nanocrystals are used. One issue with such NVM cells has been where sharp corners are involved causing points of breakdown across the thin film storage layer. This breakdown can occur in locations other than where the thin film storage layer is storing charge. The breakdown can cause leakage current which can result in high standby current and even difficulty in reading, programming, and erasing the cells.

Accordingly there is a need to provide further improvement in reducing risks of breakdown in NVM cells using thin film storage.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a non-volatile memory (NVM) cell is made by forming a hard masks over the source/drain regions and using sidewall spacer techniques to form a select gate, thin film storage, and a control gate between the hard masks. A select gate is made as a conductive sidewall spacer adjacent to one of the hard masks. The thin film storage is formed over the hard masks and the space between the hard masks. This results in a portion of the thin film storage being adjacent to the select gate in the region between the hard masks. A control gate is then formed over the portion of the thin film storage using a conformal deposition of conductive material followed by an anisotropic etch. This reduces the propensity of the thin film storage to break down and also results in a recess in the control gate that is filled with dielectric to ensure that the siliciding of the control gate and select gate does not result in a short. This is better understood by the drawings and the following written description.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
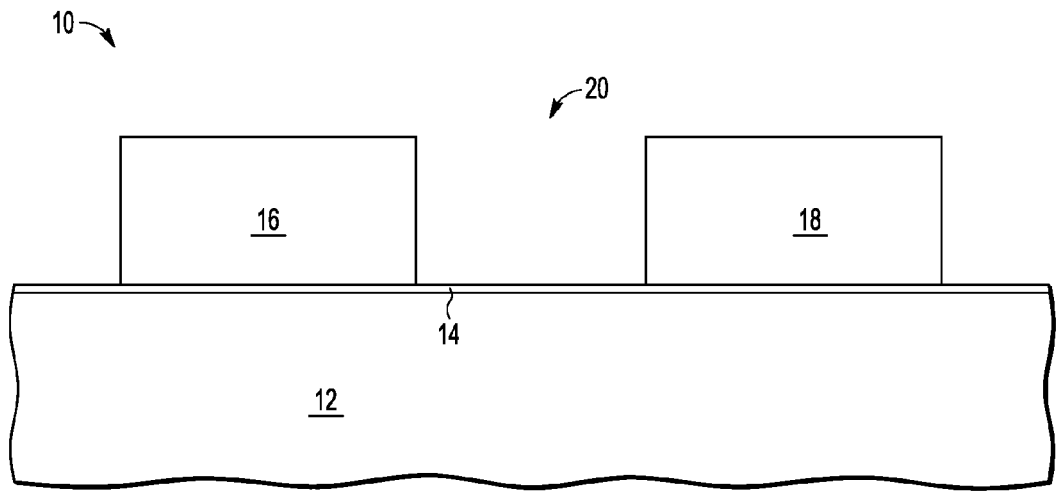
FIG. 1 is a cross section of a non-volatile memory cell at a stage in processing according to an embodiment.

Shown in FIG. 1 is a semiconductor device 10 having a substrate 12, a gate dielectric 14, a hard mask 16 over gate dielectric 14, a hard mask 18 over gate dielectric 14, and an opening 20 between hard masks 16 and 18. Hard masks 16 and 18 may be nitride. Gate dielectric 14 may be oxide that is grown at a relatively high temperature such as 900 degrees Celsius. As examples of possible dimensions, hard mask 16 may be 180 nanometers wide and 600 nanometers high, hard mask 18 may be 200 nanometers wide and 600 nanometers high, and opening 20 may be 140 nanometers wide between hard masks 16 and 18. Gate dielectric may be 2 nanometers. Other dimensions are likely also to be found to be effective as will be the case for other dimensions. Especially as processes improve, the dimensions will presumably become smaller.

Figure 2:
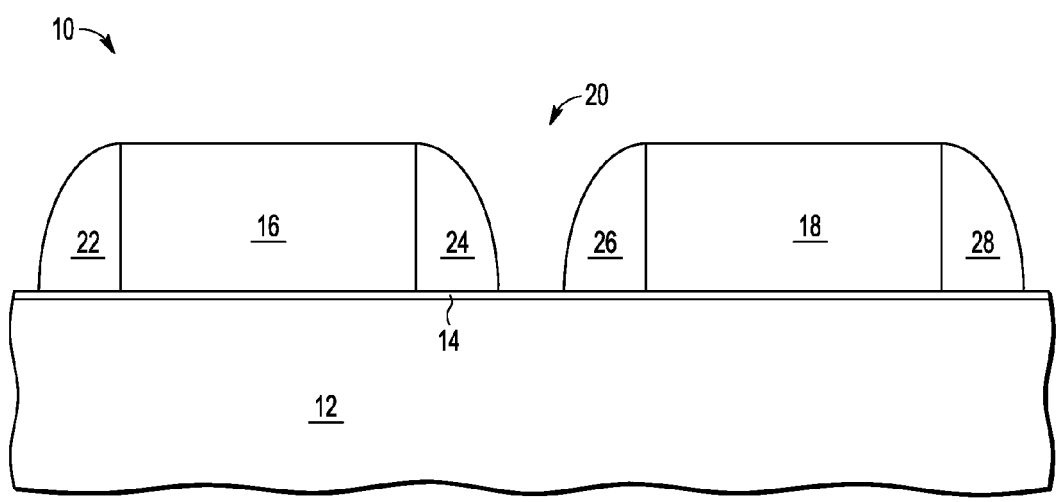
FIG. 2 is a cross section of a non-volatile memory cell of FIG. 1 at a subsequent stage in processing.

Shown in FIG. 2 is semiconductor device 10 after forming sidewall spacers 22 and 24 around hard mask 16 and sidewall spacers 26 and 28 around hard mask 18. At gate dielectric 14, sidewall spacers 22, 24, 26, and 28 may be 50 nanometers wide. A space is left between sidewall spacers 24 and 26 that may be 40 nanometers. Sidewall spacers 22 and 24 are cross sections taken at different locations on the same sidewall spacer that surrounds hard mask 16. Similarly, sidewall spacers 26 and 28 as shown are cross sections taken at different locations on the same sidewall spacer that surrounds hard mask 18. Sidewall spacers 22, 24, 26, and 28 may be polysilicon formed by depositing polysilicon and then performing an anisotropic etch. Sidewall spacers 22, 24, 26, and 28 are on gate dielectric 14. Sidewall spacers 22 and 24 will be used as select gates. Sidewall spacers 26 and 28 are the same as sidewall spacers and thus may also be called select gates but will be removed and thus not select gates in the NVM cells that will be formed.

Figure 3:
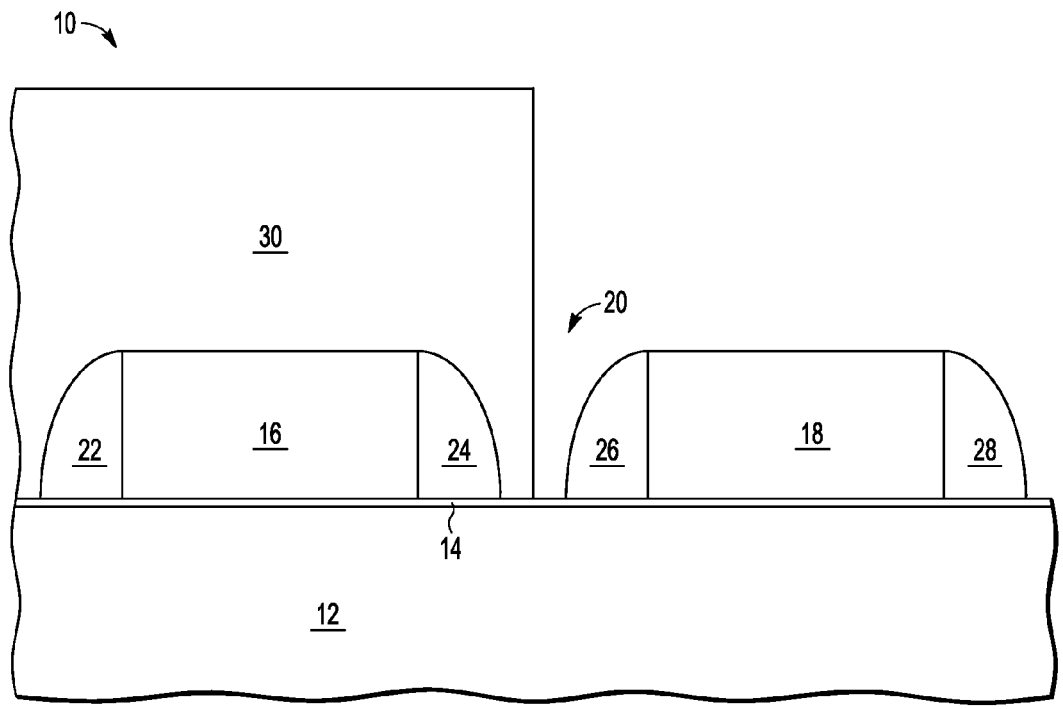
FIG. 3 is a cross section of a non-volatile memory cell of FIG. 2 at a subsequent stage in processing.

Shown in FIG. 3 is semiconductor device 10 after forming a masking layer 30, which may be photoresist, that is patterned to cover hard mask 16 and sidewall spacers 22 and 24 and expose hard mask 18 and sidewall spacers 26 and 28. An edge of masking layer 30 is between sidewall spacers. Although it may be critical that this edge be between sidewall spacers 24 and 26, the required alignment of this edge is easily achieved in the case of sidewall spacers being 40 nanometers apart.

Figure 4:
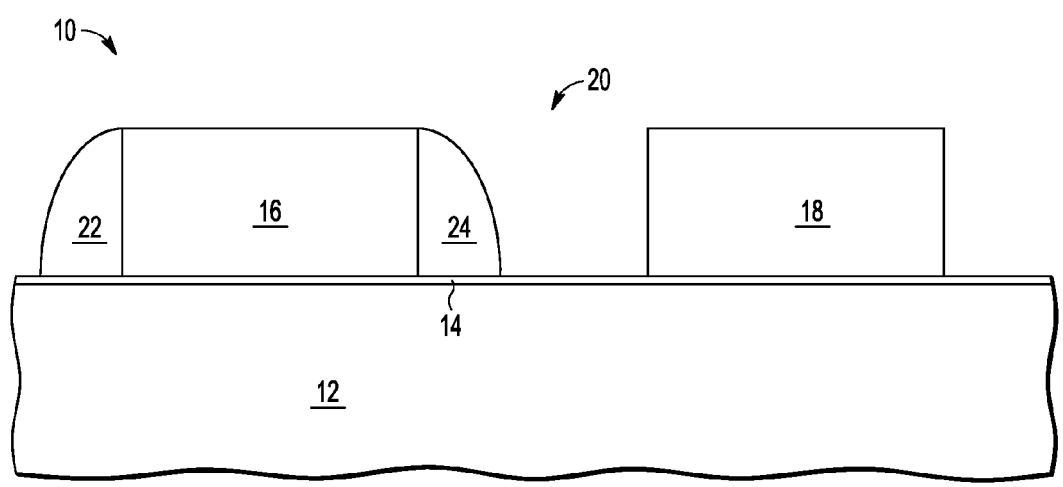
FIG. 4 is a cross section of a non-volatile memory cell of FIG. 3 at a subsequent stage in processing.

Shown in FIG. 4 is semiconductor device 10 after performing an etch that removes sidewall spacers 26 and 28. Masking layer 30 can also be designed to have a pattern that results in the connection between sidewall spacers being broken during the etch that removes sidewall spacers 26 and 28. After this etch, sidewall spacers 22 and 24 may be referenced as select gates 22 and 24.

Figure 5:
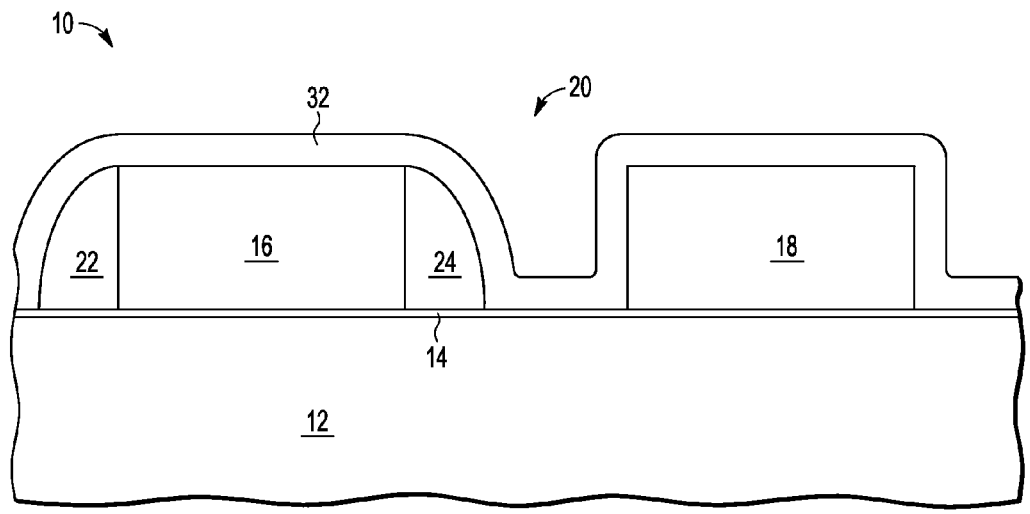
FIG. 5 is a cross section of a non-volatile memory cell of FIG. 4 at a subsequent stage in processing.

Shown in FIG. 5 is semiconductor device 10 after forming a charge storage layer 32 over hard masks 16 and 18, select gates 22 and 24, and substrate 12 between hard mask 18 and select gate 24. Gate dielectric 14 between hard mask 18 and select gate 24 may be removed before forming charge storage layer 32. Charge storage layer 32 is preferably a thin film storage layer. One approach is to grow an oxide layer, form nanocrystals on the grown oxide layer, and then depositing an oxide layer. The grown oxide will be thickest over polysilicon, a little less over substrate 12, and minimal over hard masks 16 and 18 which in this example are nitride. Thus charge storage layer 32 will not be of uniform thickness in the case of nanocrystals but may be about 20 nanometers over substrate 12 where the control gate will be formed. In the case of the thin film being nitride, the thin film is deposited and can be uniform in thickness.

Figure 6:
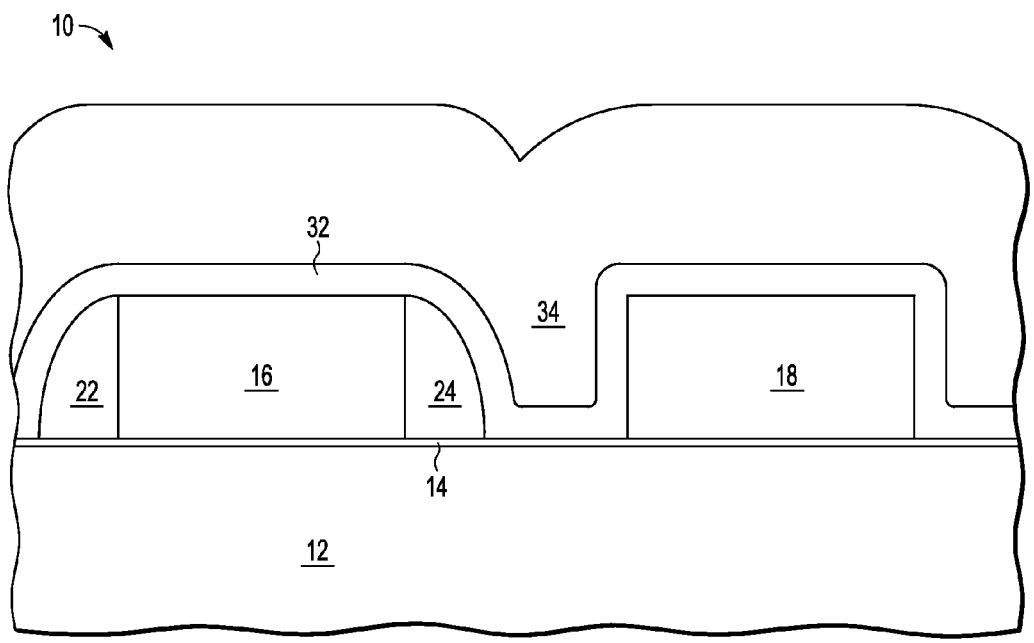
FIG. 6 is a cross section of a non-volatile memory cell of FIG. 5 at a subsequent stage in processing.

Shown in FIG. 6 is semiconductor device 10 after forming a conductive layer 34 over charge storage layer 32 that may be 120 nanometers. Conductive layer 34 may be polysilicon which deposits very conformally.

Figure 7:
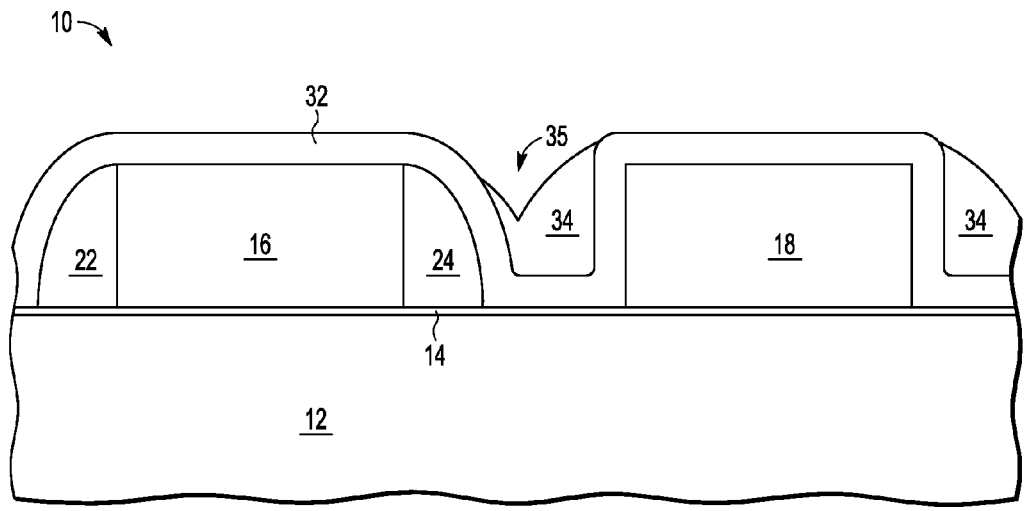
FIG. 7 is a cross section of a non-volatile memory cell of FIG. 6 at a subsequent stage in processing.

Shown in FIG. 7 is semiconductor device 10 after performing an anisotropic etch of conductive layer 34 which results in a portion of conductive layer 34. This etch is for a little more than the deposited thickness so that all of conductive layer is removed from over hard masks 16 and 18 and a portion is left between select gate 24 and hard mask 18. An analogous portion of conductive layer 34 is left on the other side of hard mask 18. Both portions will be control gates of NVM cells. Thus, for example, the portion of conductive layer 34 that is between select gate 24 and hard mask 18 may be referenced as control gate 34. As shown in FIG. 7, charge storage layer 32 has a portion that is directly between select gate 24 and a left edge of control gate 34. At this left edge interface with charge storage layer 32 as shown in FIG. 7, control gate 34 slopes away from charge storage layer 32 to reduce the electric field at this interface compared to this interface being a sharp corner. Further, the low point of control gate 34 is a recess 35 which can be conveniently filled with a dielectric to ensure that subsequent siliciding of the control gate and select gate does not result in a short.

Figure 8:
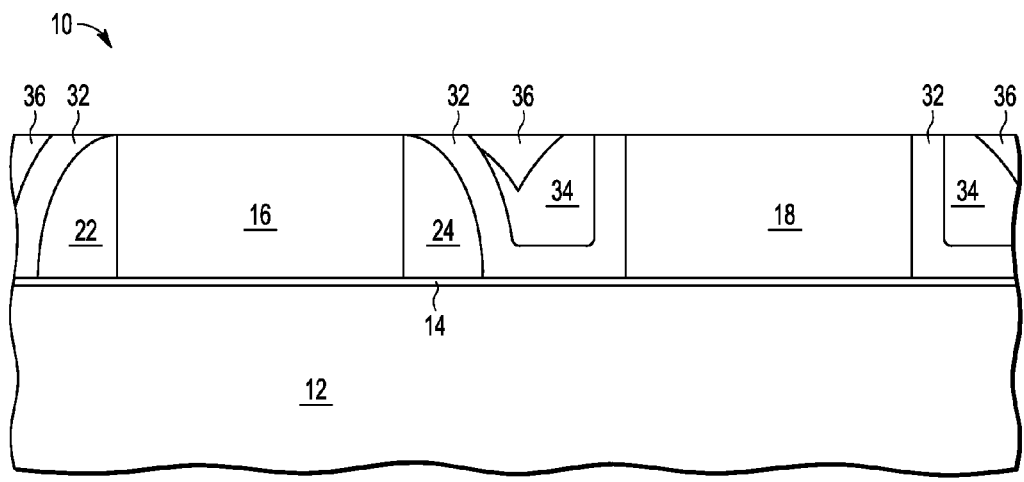
FIG. 8 is a cross section of a non-volatile memory cell of FIG. 7 at a subsequent stage in processing.

Shown in FIG. 8 is semiconductor device 10 after depositing a dielectric 36 into recess 35 and performing chemical mechanical polishing which results in a planar top surface of semiconductor device 10 coplanar with top surfaces of hard masks 16 and 18. The top planar surface between hard masks 16 and 18 includes an exposed surfaces of charge storage layer 32 over select gate 24 and along side of hard mask 18, an exposed surface of dielectric 36, and an exposed surface of control gate 34. Dielectric 36 may be oxide.

Figure 9:
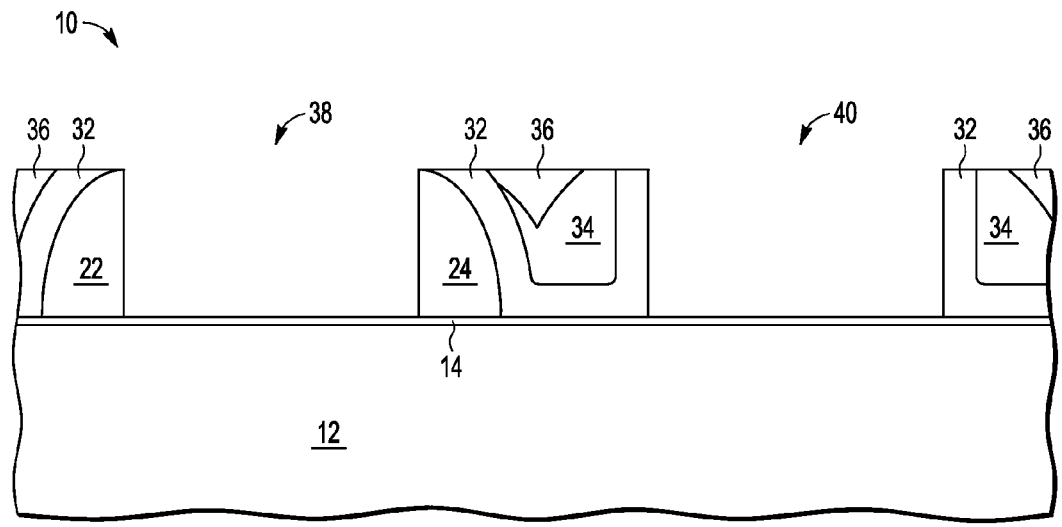
FIG. 9 is a cross section of a non-volatile memory cell of FIG. 8 at a subsequent stage in processing.

Shown in FIG. 9 is semiconductor device 10 after removing hard masks 16 and 18 to leave opening 38 where hard mask 16 had been and an opening 40 where hard mask 18 had been. This exposes gate dielectric 14 in both opening 38 and opening 40.

Figure 10:
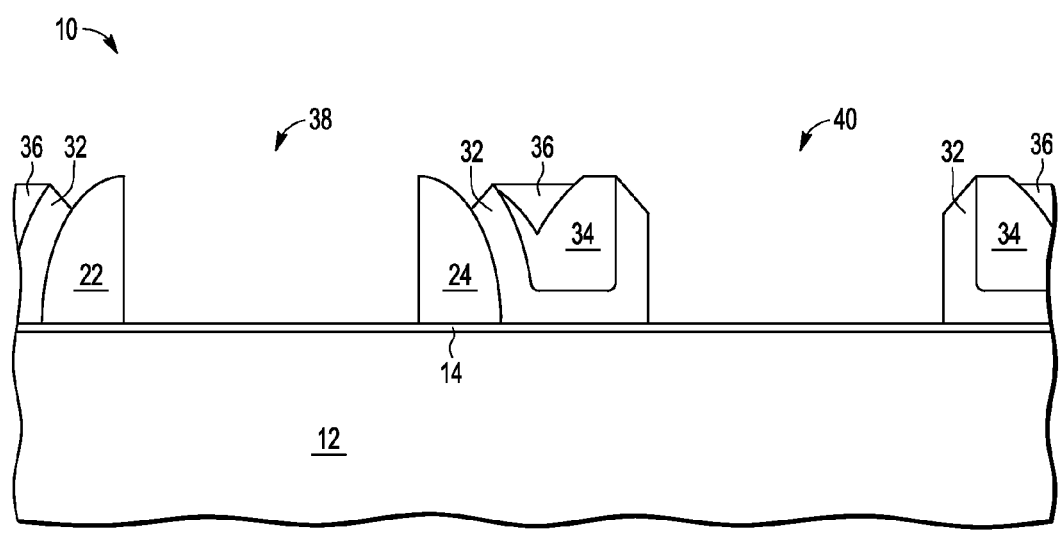
FIG. 10 is a cross section of a non-volatile memory cell of FIG. 9 at a subsequent stage in processing.

Shown in FIG. 10 is semiconductor device 10 after performing an etch back of charge storage layer 32 to expose a top portion of select gate 24.

Figure 11:
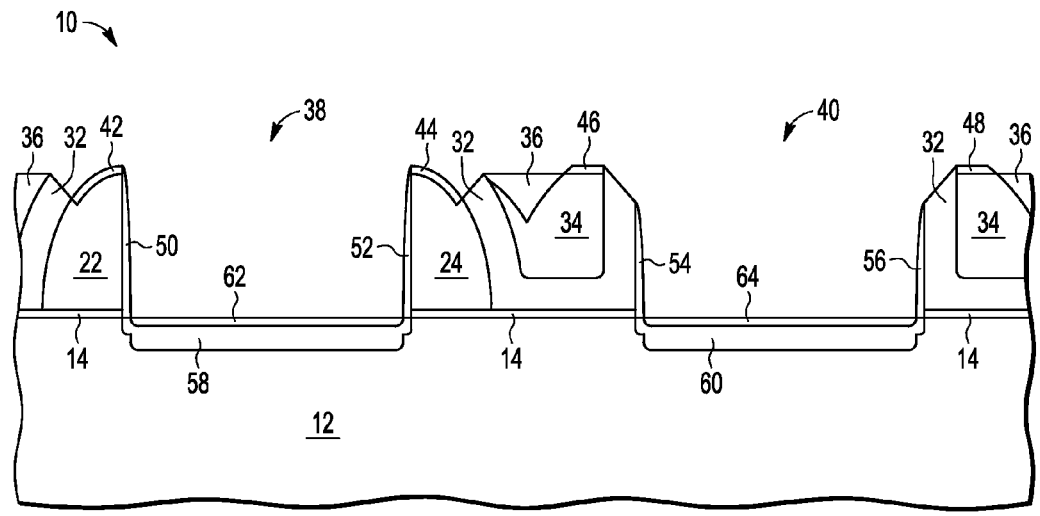
FIG. 11 is a cross section of a non-volatile memory cell of FIG. 10 at a subsequent stage in processing.

Shown in FIG. 11 is semiconductor device 10 after removing gate dielectric in openings 38 and 40, siliciding, forming sidewall spacers, and implanting. The result is silicide regions 42, 44, 46, and 48 on polysilicon, silicide 62 on substrate 12 in opening 38, and silicide 64 on substrate 12 in opening 40, a doped region 58 under silicide 62 that functions as a source/drain, and a doped region 60 under silicide 64 that functions as a source/drain. Silicides 44 and 46 are quite far apart, separated by dielectric 36, which is advantageous because it avoids the risk of the silicides shorting together. This can be a problem for silicon on polysilicon on the same NVM cell. The siliciding of the substrate is conveniently available particularly in the case of substrate 12 being silicon, at least at the surface. Semiconductor device 10 of FIG. 11 shows a completed NVM cell having a select gate 24 on a gate dielectric 14, a charge storage layer 32, a control gate 34 over charge storage layer 32, and source/drains 58 and 60. As an alternative, a portion of charge storage layer 32, which is the portion currently shown as adjacent to source/drain 60, may be removed prior to source/drain formation. This would shorten the channel length of the NVM cell.

Figure 12:
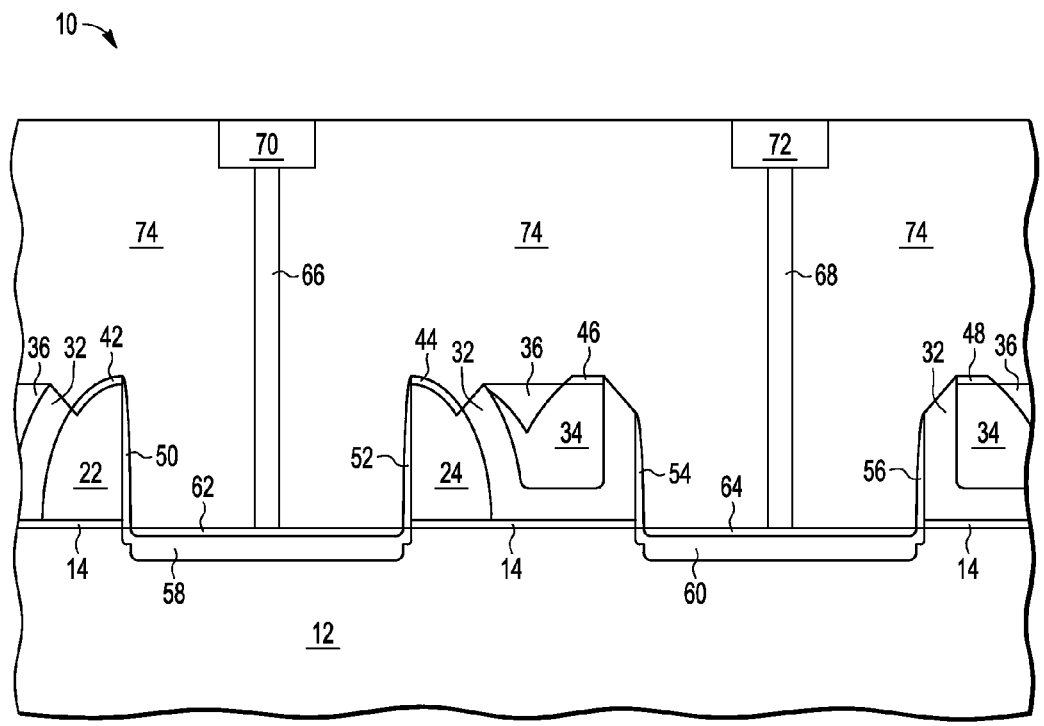
FIG. 12 is a cross section of a non-volatile memory cell and a replacement gate transistor of FIG. 11 at a subsequent stage in processing.

Shown in FIG. 12 is semiconductor device 10 after forming an interlayer dielectric (ILD) over the substrate 12 having a thickness that may be 500 nanometers, a via 66 contacting source/drain 58 through silicide 62 and contacting a metal layer 70 at a top surface of ILD 74, and a via 68 contacting source/drain 60 through silicide 64 and contacting a metal layer 72 at a top surface of ILD 74.

Thus, it is shown that an NVM cell can reduce high fields by forming select gates and control gates using sidewall spacer techniques in the forming of the select gates and control gates. The benefits of siliciding the top surfaces of the control gate, select gate, and source/drain regions can still be maintained. Further, that a recess in the control gate can be filled with dielectric to ensure that the siliciding of the select gate and control gate does not result in them shorting together.

By now it should be appreciated that there has been provided a semiconductor structure having a substrate. The semiconductor structure further includes a select gate formed on the substrate. The semiconductor structure further includes a control gate formed on the substrate. The semiconductor structure further includes a charge storage layer formed between a sidewall of the select gate and a first sidewall of the control gate. The semiconductor structure further includes a dielectric material formed between a portion of the control gate and a portion of the charge storage layer, wherein the dielectric material is positioned to separate a contact portion of the control gate from a contact portion of the select gate. The semiconductor structure may have a further characterization by which the charge storage layer includes a bottom dielectric layer formed along the sidewall of the select gate and a channel region of the substrate under the control gate, a layer of charge storage elements formed on the bottom dielectric layer, and a top dielectric layer formed over the layer of charge storage elements. The semiconductor structure may have a further characterization by which a height of a portion of a top surface of the control gate is the same as a height of a portion of a top surface of the select gate. The semiconductor structure may have a further characterization by which the dielectric material is formed in a recess portion in one side of the control gate adjacent the charge storage layer. The semiconductor structure may further include select gate is formed as a spacer using polysilicon material. The semiconductor structure may further include the control gate is formed as a spacer using polysilicon material. The semiconductor structure may have a further characterization by which the semiconductor structure is a flash memory cell. The semiconductor structure may further include a curved portion of a sidewall of the select gate faces a curved portion of a second sidewall of the control gate, wherein the sidewall of the select gate and the curved portion of the second sidewall of the control gate are separated by the charge storage layer. The semiconductor structure may have a further characterization by which the charge storage layer extends along a third sidewall of the control gate.

Also described is a method of forming a flash memory cell. The method further includes forming a first hard mask and a second hard mask on a substrate. The method further includes forming a select gate as a spacer around the first hard mask. The method further includes forming a charge storage layer over the first and second hard masks and the select gate. The method further includes forming a control gate as a spacer around the second hard mask. The method further includes filling a recess in the control gate with a dielectric material, the recess is formed between a curved sidewall of the control gate and a sidewall of the charge storage layer directly adjacent the curved sidewall of the control gate. The method may further include chemically-mechanically polishing the dielectric material, the select gate, the charge storage layer, and the control gate. The method may have a further characterization by which the forming the select gate as the spacer includes using a spacer etch. The method may have a further characterization by which the forming the control gate as the spacer includes using a spacer etch. The method may further include removing a portion of the charge storage layer adjacent a top portion of a curved sidewall of the select gate. The method may further include removing the first and second hard mask.

Described also is a method including forming a first and second hard mask on a semiconductor substrate, the first and second hard masks are separated from each other by more than a desired channel length for a flash memory cell. The method further includes depositing a layer of polysilicon material over and between the first and second hard masks. The method further includes etching the layer of polysilicon material to form select gates around the first and second hard masks. The method further includes masking the first hard mask and the select gate around the first hard mask. The method further includes removing the select gate around the second hard mask. The method further includes unmasking the first hard mask and the select gate around the first hard mask. The method further includes forming a charge storage layer over the first and second hard masks and the select gate around the first hard mask. The method further includes depositing another layer of polysilicon material over the select gate and the first and second hard mask. The method further includes etching the other layer of polysilicon material to form a control gate around the second hard mask, wherein the select gate, the charge storage layer and the control gate are part of the flash memory cell. The method may further include filling a space between a sidewall of the control gate and a sidewall of the charge storage layer directly adjacent the sidewall of the control gate with a dielectric material. The method may further include chemically-mechanically polishing the dielectric material, the select gate, the charge storage layer and the control gate to remove portions of the charge storage layer over the first and second hard masks. The method may have a further characterization by which the forming the charge storage layer includes growing a thermal oxide, and depositing a dielectric material over the charge storage material. The method may have a further characterization by which the charge storage material comprises one of a group consisting of nanocrystals and a layer of nitride.

Although the invention is described herein with reference to specific embodiments, various modifications and changes can be made without departing from the scope of the present invention as set forth in the claims below. For example, other materials may be found to be effective than those described. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of forming a flash memory cell comprising:
   forming a first hard mask and a second hard mask on a substrate;
   forming a select gate as a spacer around the first hard mask;
   forming a charge storage layer over the first and second hard masks and the select gate;
   forming a control gate over the charger storage layer, the control gate formed as a spacer around the second hard mask; and
   filling a recess in the control gate with a dielectric material, the recess is formed between a curved sidewall of the control gate and a sidewall of the charge storage layer directly adjacent the curved sidewall of the control gate.

2. The method of claim 1 further comprising:
   chemically-mechanically polishing the dielectric material, the select gate, the charge storage layer, and the control gate.

3. The method of claim 1, wherein:
   the forming the select gate as the spacer includes using a spacer etch.

4. The method of claim 1, wherein:
   the forming the control gate as the spacer includes using a spacer etch.

5. The method of claim 4 further comprising:
   removing the first and second hard mask.

6. The method of claim 5 further comprising:
   removing a portion of the charge storage layer adjacent a top portion of a curved sidewall of the select gate.

7. A method comprising:
   forming a first and second hard mask on a semiconductor substrate, the first and second hard masks are separated from each other by more than a desired channel length for a flash memory cell;
   depositing a layer of polysilicon material over and between the first and second hard masks;
   etching the layer of polysilicon material to form select gates around the first and second hard masks;
   masking the first hard mask and the select gate around the first hard mask;
   removing the select gate around the second hard mask;
   unmasking the first hard mask and the select gate around the first hard mask;

forming a charge storage layer over the first and second hard masks and the select gate around the first hard mask;

depositing another layer of polysilicon material over the charge storage layer and the select gate and the first and second hard mask; and etching the other layer of polysilicon material to form a control gate around the second hard mask, wherein the select gate, the charge storage layer and the control gate are part of the flash memory cell.

8. The method of claim 7 further comprising:

filling a space between a sidewall of the control gate and a sidewall of the charge storage layer directly adjacent the sidewall of the control gate with a dielectric material.

9. The method of claim 8 further comprising:

chemically-mechanically polishing the dielectric material, the select gate, the charge storage layer and the control gate to remove portions of the charge storage layer over the first and second hard masks.

10. The method of claim 7 wherein the forming the charge storage layer includes:

growing a thermal oxide;

depositing a charge storage material over the thermal oxide; and depositing a dielectric material over the charge storage material.

11. The method of claim 10 further comprising:

the charge storage material comprises one of a group consisting of nanocrystals and a layer of nitride.

* * * * *